United States Patent [19]
Yamazaki et al.

[11] Patent Number: 5,541,138
[45] Date of Patent: Jul. 30, 1996

[54] LASER PROCESSING METHOD, AND METHOD FOR FORMING INSULATED GATE SEMICONDUCTOR DEVICE

[75] Inventors: Shunpei Yamazaki, Tokyo; Yasuhiko Takemura, Kanagawa, both of Japan

[73] Assignee: Semiconductor Energy Laboratory Co., Ltd., Atsugi, Japan

[21] Appl. No.: 142,048

[22] Filed: Oct. 28, 1993

[30] Foreign Application Priority Data

Oct. 30, 1992 [JP] Japan ................................ 4-316138

[51] Int. Cl.⁶ ............................................. H01L 21/306
[52] U.S. Cl. ........................ 437/174; 437/44; 437/950
[58] Field of Search .......................... 437/19, 43, 154, 437/165, 173, 174, 950, 44; 148/DIG. 144

[56] References Cited

U.S. PATENT DOCUMENTS

| | | | |
|---|---|---|---|
| 4,780,424 | 10/1988 | Holler et al. | 437/43 |
| 4,861,730 | 8/1989 | Hsia et al. | 437/43 |
| 5,114,876 | 5/1992 | Weiner | 437/174 |
| 5,158,903 | 10/1992 | Hori et al. | 437/44 |
| 5,180,690 | 1/1993 | Czubatyj et al. | 437/165 |

OTHER PUBLICATIONS

Sameshima et al., "XeCl excimer laser annealing used to Fabricate poly–si TFTs", Mat. Res. Soc. Symp. Proc., vol. 71, 1986, pp. 435–440.

Carey et al., "A shallow junction submicrometer PMOS process without high temperature anneals", IEE electron device letters, vol. 9, No. 10, Oct. 1988, pp. 542–544.

"Fabrication of Submicrometer MOSFET's Using Gas Immersion Laser Doping (GILD)" IEEE Electron Device Letters Vol. EDL–7, No. 7 pp. 440–442, Jul. 1986.

*Primary Examiner*—Chandra Chaudhari
*Attorney, Agent, or Firm*—Sixbey, Friedman, Leedom & Ferguson, P.C.; Gerald J. Ferguson, Jr.; Eric J. Robinson

[57] ABSTRACT

A laser doping process comprising: irradiating a laser beam operated in a pulsed mode to a single crystal semiconductor substrate of a first conductive type in an atmosphere of an impurity gas which imparts the semiconductor substrate a conductive type opposite to said first conductive type and incorporating the impurity contained in said impurity gas into the surface of said semiconductor substrate, thereby modifying the type and/or the intensity of the conductive type thereof. Provides devices having a channel length of 0.5 $\mu$ or less and impurity regions 0.1 $\mu$ m or less in depth.

24 Claims, 8 Drawing Sheets

LASER PROCESSING METHOD, AND METHOD FOR FORMING INSULATED GATE SEMICONDUCTOR DEVICE

BACKGROUND OF THE INVENTION

1. Field of the Invention

The present invention relates to a technique for fabricating a semiconductor device such as a semiconductor integrated circuit in which a doping process is incorporated, and it relates also to a semiconductor device (element) fabricated by the same technique.

2. Prior Art

Diffusion and ion implantation processes are the conventionally known processes practiced in the art for doping impurities. Diffusion process comprises heating the semiconductor under an atmosphere of high temperature in the range of from 500 to 1,200° C. to allow impurities to diffuse inside the semiconductor. Ion implantation comprises accelerating ionized impurities in an electric field, and bombarding the desired portions of the semiconductor with the thus accelerated ions. However, the ion implantation process causes considerable damage to the crystal structure due to the high energy ions bombarded to the semiconductor, and leaves the semiconductor in an amorphous state or a state similar thereto. Accordingly, the above diffusion process or a thermal treatment equivalent thereto is necessary to recover the crystal from the considerably impaired electrical properties. The ion implantation process is indispensable in fabricating VLSI (very large scale integration) and ULSI (ultra large scale integration), because the impurity concentration can be more easily controlled by this process as compared with the diffusion process.

The ion implantation process, however, is not completely free of problems. The problem to be considered first is how to control the diffusion of the implanted ions. This problem is particularly serious in the so-called quarter-micron devices, in which the design requires a rule of 0.5 μm or less in width. Recently, the formation of a shallow impurity-diffused domain (diffusion region) is further required. However, it is difficult to form a shallow diffusion region of 0.1 μm or less in depth with sufficient reproducibility. The above problems are discussed in further detail below referring to FIG. 2.

The first problem above occurs because the ions implanted into the semiconductor by ion implantation diffuse along the sides due to secondary scattering, and because the ions extend thermally around the bombarded portion during the thermal treatment. These effects were of no problem in the conventional processes in which the design rule (typically the width of a gate contact of a MOSFET) was still in the range of 1.0 μm or more. However, with a rule below 1.0 μm, the diffusion portion which forms due to the above effect then accounts for a larger area as compared with the width of the gate contact. Referring to FIG. 2(A), a gate contact 205 then geometrically overlaps diffusion regions (source and drain) 202 and 203. Such an overlap may form a parasitic capacitance for the gate contact and the source and drain, to result in lowering of the operation speed.

The second problem occurs due to roughly classified two reasons. One is attributed to the thermal diffusion similar to the case pointed in the above first problem. This makes it difficult to reduce the diffusion region to a thickness of 0.1 μm or less. The other is due to the channeling effect which accompanies the ion implantation, and is particularly distinct when a crystalline semiconductor is used. That is, the ions incident vertical to the crystal plane pass without being scattered as to reach a deep portion inside the substrate.

To circumvent the channeling effect, the ion implantation in the conventional processes was performed by taking an incident angle of several degrees with respect to the crystal plane. However, there had been cases in which the orbit of the ions was bent inside the semiconductor to incidentally match with the channeling condition. Then, the ions penetrate deep into the substrate as shown in FIG. 2(B). When ion implantation is performed on a polycrystalline semiconductor, on the other hand, the ions then accommodate themselves at various depth levels because the crystal planes are randomly distributed in a polycrystalline semiconductor.

Furthermore, other problems are encountered when a polycrystalline semiconductor is used. In a polycrystalline semiconductor, the doped impurities tend to undergo thermal diffusion along the grain boundaries between the crystals. Accordingly, as shown in FIG. 2(C), a uniform doping is not feasible for a polycrystalline semiconductor. These problems remains unsolved as long as a conventional process of ion implantation with recrystallization by heat treatment is taken. As a matter of course, a diffusion process is far from being a solution to the problem.

A problem to be solved by the present invention is to prevent impurities from being diffused along the lateral sides. Another problem to be solved by the present invention is to control the diffusion of the impurities within a depth of 0.1 μm, and preferably within 50 nm. An object of the present invention is to provide a solution for either or both of the problems above, using a single crystal or a polycrystalline semiconductor, or any semiconductor material similar thereto. As a result, the present invention enables stable fabrication of a MOS device having a channel length of 1.0 μm or shorter, and typically, such having a channel length in the range of from 0.1 to 0.3 μm.

SUMMARY OF THE INVENTION

The present invention provides a laser doping process for incorporating impurities into a semiconductor substrate, which comprises irradiating a laser operated in a pulsed mode to the surface of a semiconductor substrate in an atmosphere containing a high purity reactive gas (impurity gas) for imparting a conductive type to the semiconductor substrate and a relatively stable gas such as hydrogen, fluorine, helium, and argon as a diluent. This process allows the substrate to be impurity-doped only in an extremely thin portion of the surface, because the impurities at the vicinity of the surface of the semiconductor react with the surface of the semiconductor or are decomposed when the substrate is heated instantaneously. The thickness of the doped portion can be made as thin as 0.1 μm or less, though depending on the temperature at which the surface of the substrate is maintained.

In the reaction above of the impurity gases with the surface of the semiconductor substrate, the thermal diffusion of the impurities can be substantially prevented by irradiating laser in pulses 1 μ sec or less in pulse width, and preferably, in pulses 100 nsec or less in width. Unlike the conventional ion implantation processes, no channeling nor secondary scattering occurs in the process according to the present invention. Accordingly, an extremely ideal diffusion region can be formed as shown in FIG. 1(A) with a depth profile of impurity distribution shown in FIG. 1(B). It can be seen that the impurities are concentrated only in the desired depth. The impurities are distributed also in the lateral direction in a strict sense, however, the extent of distribution is typically in a practically negligible size of smaller than 50 nm.

Furthermore, as shown in FIG. 1(C), the diffusion region can be kept free from the influence of grain boundaries, because no thermal effect is cast on any semiconductor material having grain boundaries. In addition, impurities can be diffused in a never realized high concentration because heating in the process according to the present invention is effected in a thermal disequilibrium state using laser in a pulsed operation mode.

DETAILED DESCRIPTION OF THE INVENTION

Figure 1A:
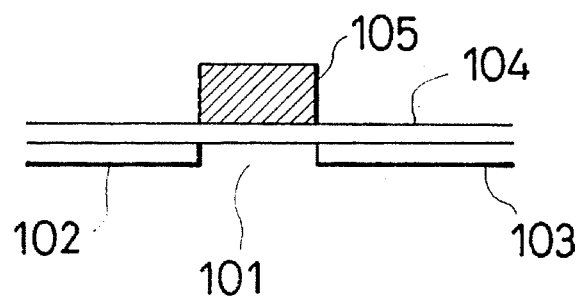
FIGS. 1(A) to 1(C) are explanatory drawings which show schematically an effect of the present invention.
Figure 1B:
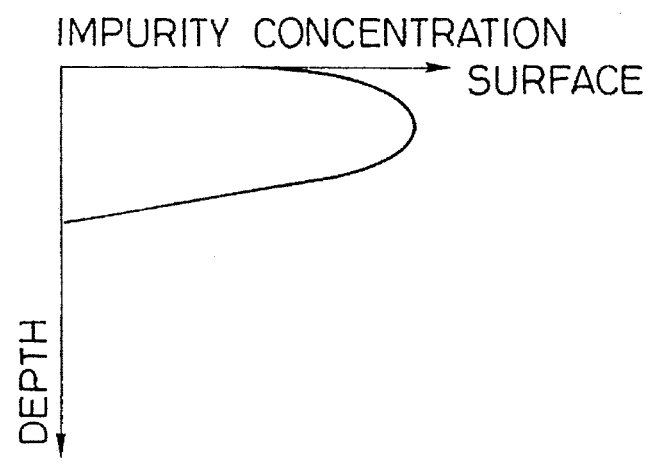
Figure 1C:
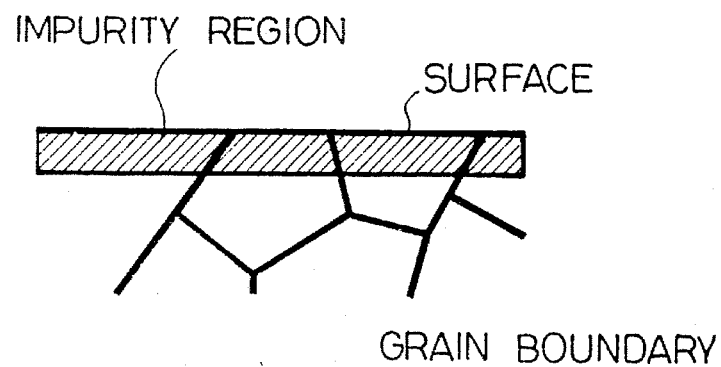
Figure 2A:
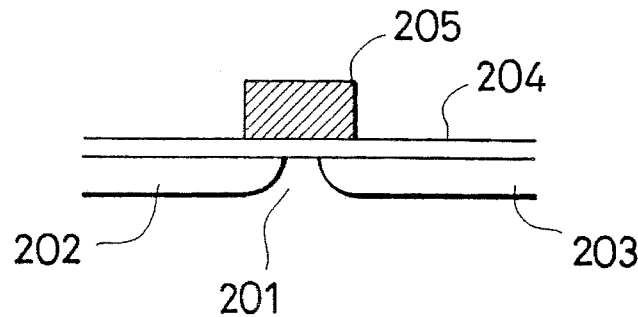
FIGS. 2(A) to 2(C) are explanatory drawings which show schematically the problems of prior art techniques.
Figure 2B:
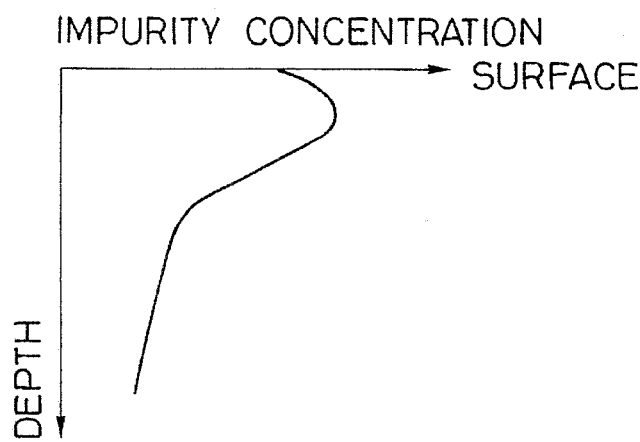
Figure 2C:
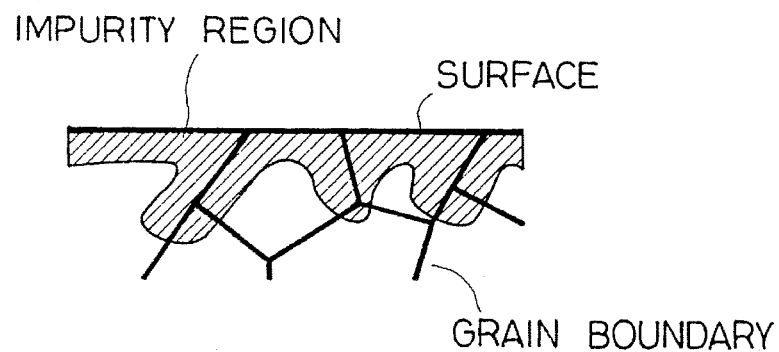

In the process according to the present invention, the impurity concentration can be controlled by varying, for instance, the energy of the laser, the concentration of the impurity gas in the atmosphere, and the surface temperature of the semiconductor. The surface of the semiconductor in which the impurity is diffused may be either exposed or covered with another coating. The coating of another material blocks the impurities depending on the chemical and physical properties of the coating, thereby controlling the concentration and the depth of the diffusion in the semiconductor.

The impurities for use in the present invention include a trivalent impurity, representatively boron (B), etc., to render, for example, a silicon semiconductor P-conductive. To impart N-type conductivity to the silicon semiconductor, for example, a pentavalent impurity, representatively phosphorus (P) and arsenic (As) may be used. The reactive gases containing those impurities include $ASH_3$, $PH_3$, $BF_3$, $BCl_3$, and $B(CH_3)_3$.

The semiconductor for use generally in the present invention includes, not only the conventional wafers of single crystal silicon semiconductor, but also amorphous silicon semiconductor thin films deposited by vapor phase growth processes, sputtering, etc if a TFT is to be fabricated. The present invention is also applicable to a polycrystalline or single crystal silicon semiconductor fabricated by a liquid phase growth process on an insulator substrate. As a matter of course, the present invention is not only limited on silicon semiconductor, and other semiconductors can be employed as well.

The use of an excimer laser apparatus operated in a pulsed mode as the laser source is preferred in the present invention. A laser operating in a pulsed mode can instantaneously heat an area of a sample confined on the surface without influencing the substrate. A laser operating in a continuous wave (cw) mode cannot realize such a state of thermal disequilibrium. Moreover, such an intense local heating which results from a cw-mode laser may cause peeling off of the heated portion due to, for example, considerable difference in thermal expansion between the heated portion and the substrate. In contrast with the case of the cw-mode laser above, heating using a pulsed laser causes no mechanical damage to the sample and the substrate, because the thermal relaxation time of a pulsed laser is negligibly small as compared with the reaction time of a mechanical stress such as thermal expansion.

In particular, an excimer laser emits an ultraviolet (UV) light which can be absorbed efficiently by semiconductors such as silicon, and the duration of a pulse is as short as 10 nsec. Furthermore, excimer lasers have already gained reputation in fabricating a thin film of polycrystalline silicon of high crystallinity by irradiating laser and crystallizing a thin film of amorphous silicon. Specifically mentioned as lasers suited for use in the present invention are an ArF excimer laser emitting light at a wavelength of 198 nm, a XeCl excimer laser (808 nm in wavelength), a XeF excimer laser (351 nm in wavelength), and a KrF excimer laser (248 nm in wavelength).

The surface of the semiconductor may be either heated or cooled in the process according to the present invention. The diffusion of the impurities may be either accelerated or suppressed by controlling the surface temperature. Thus, it is recommended to the operator to control the surface temperature to obtain the desired impurity concentration and diffusion depth profile of the impurity.

The use of a DC or an AC electric energy for producing a plasma of the impurity gas is also effective for accelerating the decomposition of the impurity gas. In general, a 13.56-MHz high frequency wave energy is applied as an electromagnetic energy to implement this. Accordingly, even when a doping gas which cannot be decomposed directly using the laser beam alone is used, an efficient doping can be effected by decomposing the gas using the electromagnetic energy. The electromagnetic energy need not necessarily be a 13.56-MHz high frequency wave, and, for example, the use of a 2.45-GHz microwave further improves the activation ratio. Otherwise, an ECR condition using the interaction between a 2.45-GHz microwave and a 875-Gauss magnetic field may be realized. It is also effective to use an optical energy capable of directly decomposing the doping gas.

Figure 3:
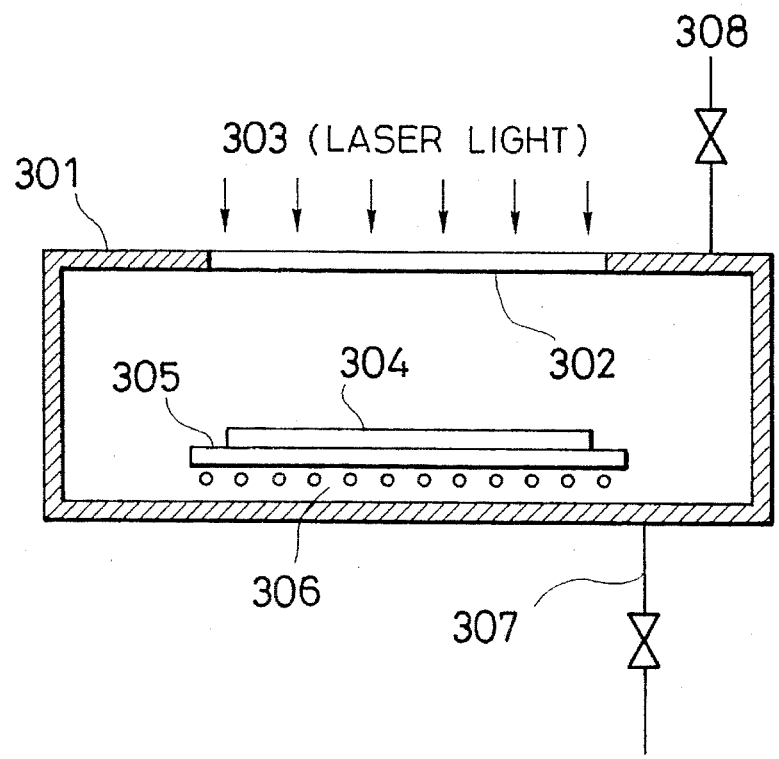
FIG. 3 shows schematically an apparatus for treating semiconductors (impurity doping) according to an embodiment of the present invention.
Figure 4:
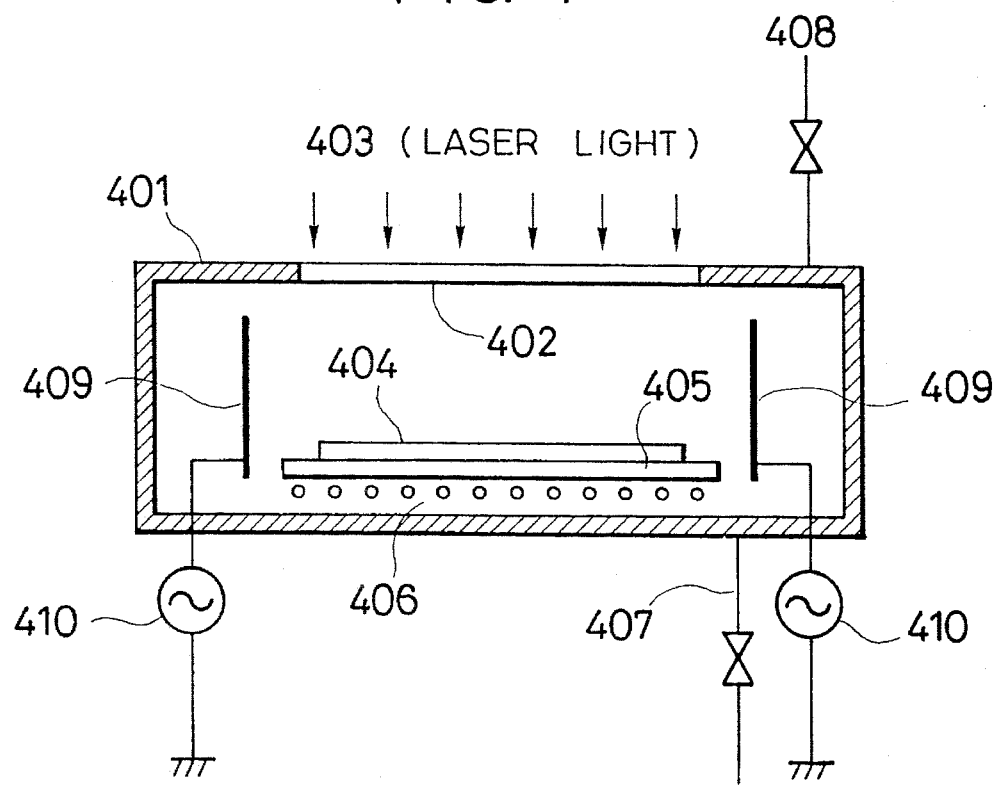
FIG. 4 shows schematically another apparatus for treating semiconductors (impurity doping) according to another embodiment of the present invention.

FIGS. 3 and 4 each show schematically the apparatuses according to the present invention. FIG. 3 shows an apparatus equipped with a device for heating the substrate, and FIG. 4 shows one further equipped with an additional electromagnetic device for generating a plasma. It should be noted that these figures are schematic drawings, and a practical apparatus may naturally include other components depending on needs. The mode of operating the apparatuses is described below.

Referring to FIG. 3, a sample 304 is set on a sample horder 305 placed inside a main chamber 301 which is initially evacuated through an evacuation system 307 connected to an evacuation apparatus. The initial state is preferably evacuated to a vacuum degree as high as possible, because the atmospheric components carbon, nitrogen, and oxygen are generally unfavorable for the semiconductor. The above elements are generally taken into the semiconductor, and tend to lower the activity of the impurities doped at the same time. Moreover, foreign substance thus incorporated into the semiconductor impairs the crystallinity of the semiconductor to provide a cause for forming dangling bonds at the grain boundaries. Accordingly, the main chamber should be evacuated to a vacuum of $10^{-6}$ Torr or lower, and preferably, to a vacuum of $10^{-8}$ Torr or lower.

It is also favorable to operate a heater 306 just before or after operating the evacuation system to thereby drive the adsorbed atmospheric components out of the main chamber. Preferred also is to construct a structure similar to the present vacuum devices; a pre-chamber is provided outside the main chamber to prevent the main chamber from being brought into direct contact with the atmosphere. As a matter of course, the use of a turbo molecular pump or a cryo pump having no fear of contamination, such as of carbon, is preferred to a rotary pump or an oil diffusion pump.

After the main chamber is sufficiently evacuated, a reactive gas is introduced into the chamber via a gas system 308. The reactive gas may be a single gas or may be diluted with hydrogen, argon, helium, neon, etc. The gas may be introduced at an atmospheric pressure or at a reduced pressure. Those conditions are selected considering, for example, the type of the semiconductor, the concentration of the impurities, the depth of the impurity region, and the temperature of the substrate.

Then, a laser beam 303 is irradiated through a window 302 to the sample. The sample at this stage is heated and maintained at a predetermined temperature. The laser beam is irradiated, in general, for about 1 to 50 pulses per point. If the pulse repetition times should be too few for a greatly fluctuating laser energy output, a high probability of failure would result. However, too many pulses irradiated per point is not preferred from the view point of realizing mass production (high throughput). The present inventors have found the above range to be favorable from the viewpoints of both throughput and product yield.

For instance, a pulsed laser beam having a specified rectangular shape 10 mm (x-direction) x 30 mm (y-direction) in size may be irradiated to a same portion for a duration of 10 pulses and then moved to the next portion. Otherwise, the laser may be sequentially moved i mm each time a laser pulse is irradiated.

After the laser irradiation step is completed, the main chamber is evacuated to vacuum, and the sample is taken out of the chamber after cooling it to room temperature. It can be seen that the doping process according to the present invention can be implemented rapidly and simply. For comparison, a conventional ion implantation process consisting of the following three steps:

(1) forming a doping pattern (coating the substrate with a resist, exposing, and developing);

(2) implanting ions (or ion doping); and (3) recrystallizing; may be contrasted to the two-step process according to the present invention comprising the following:

(1) forming a doping pattern (coating the substrate with a resist, exposing, and developing); and (2) irradiating a laser.

Referring to FIG. 4, the basic structure of the apparatus is approximately the same as that shown in FIG. 3.

A main chamber 401 is evacuated first through an evacuation system 407 connected to an evacuation apparatus, and a reactive gas is introduced therein via a gas system 408. Then, laser beam is irradiated via a window 402 to a sample 404 mounted on a sample holder 405. At the same time, electric power is applied to an electrode 409 from a high frequency wave or AC (or DC) power source 410 to thereby generate a plasma and the like inside the chamber to activate the reactive gas. The electrode is in a capacitive coupling in the figure, but it may be coupled to an inductance. Furthermore, the sample holder may be used as the other electrode even when the electrode is coupled with a capacitance. In addition, the sample may be heated with a heater 408 while irradiating a laser.

Figure 5:
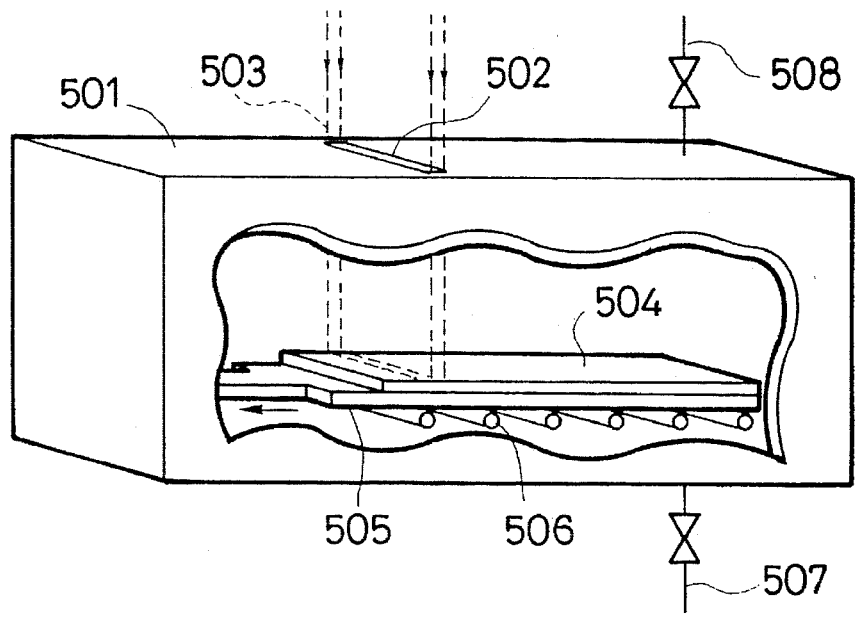
FIG. 5 shows schematically further another apparatus for treating semiconductors (impurity doping) according to further another embodiment of the present invention.

Referring to FIG. 5, another apparatus for use in the doping process is described. A slit-like window 502 made of anhydrous quartz glass is provided in the chamber 501. The laser beam is shaped into a slim rectangle according to the window. For instance, a laser beam may have a cross section of 10 mm×300 mm in size, and it is fixed to a predetermined position. The chamber is equipped with an evacuation system 50? and a gas system 508 for introducing a reactive gas. A sample 504 is mounted on a sample holder 505 placed inside the chamber, and an infrared lamp 508 which functions as a heater is provided under the sample holder. The sample holder is set movable so that the sample may be moved in accordance with the laser shots.

In an apparatus of this configuration, the temperature control should be made as careful as possible because the mechanism for moving the sample is assembled inside the chamber and is therefore subject to thermal expansion which may cause mal-alignment. The maintenance inside the chamber is rather complicated, because the sample transport mechanism is a source of dust.

Figure 8A:
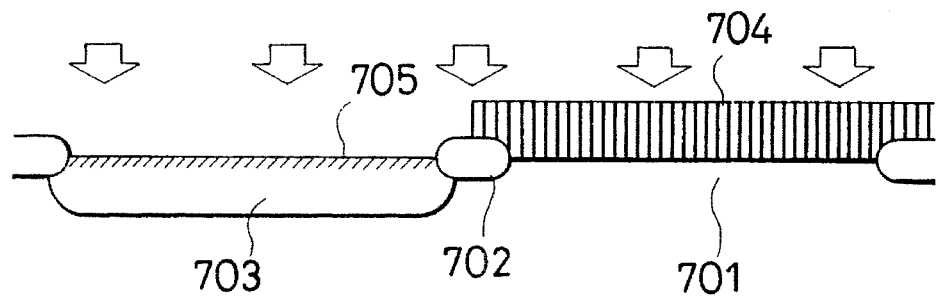
FIGS. 8(A) to 8(D) show a process of fabricating a semiconductor device according to an embodiment of the present invention.
Figure 8B:
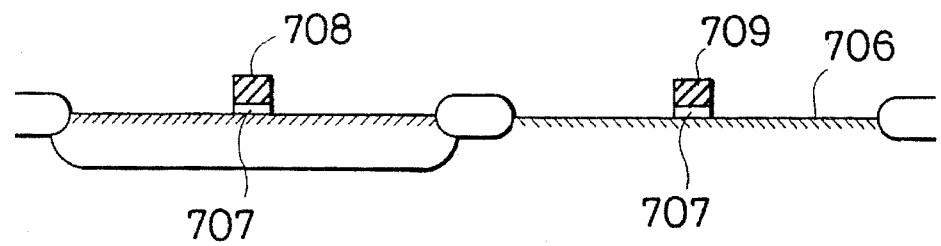
Figure 8C:
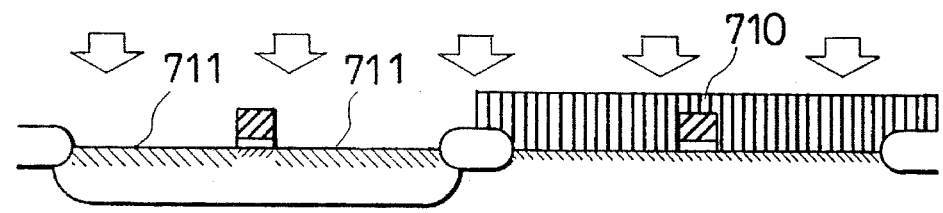
Figure 8D:
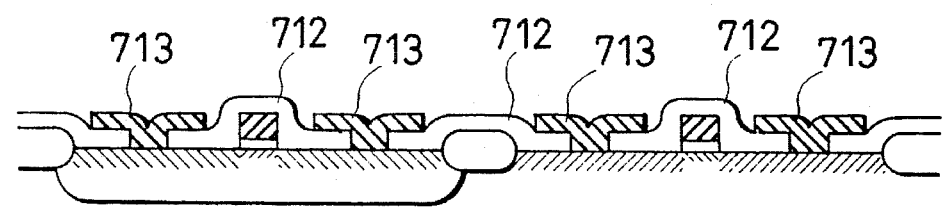

Referring to FIG. 8(A), another apparatus for use in doping process is described below. A chamber 601 is provided with a window 602 made of an anhydrous quartz glass. In contrast to the case above, the window provided to this chamber is so large as to cover the entire surface of a sample 604. An evacuation system 607 and a gas system 608 for introducing a reactive gas are connected to the chamber. A sample 605 is mounted on a sample holder 605 having a built-in heater, and are altogether provided inside the chamber. The sample holder is fixed inside the chamber. A chamber foundation 601a is provided under the chamber so that the entire chamber may be moved sequentially in accordance with the laser pulses. The laser beam used herein has a slim shape similar to the one used in the apparatus shown in FIG. 5. For instance, a laser beam having a rectangular cross section 5 mm×100 mm in size is used. Similar to the case shown in FIG. 5, the position of the laser beam is fixed. However, the present apparatus differs from that shown in FIG. 5 in that a mechanism for moving the entire chamber is used. Accordingly, the maintenance of the apparatus is made far facile because no mechanically movable mechanism which generates dust, etc., is incorporated inside the chamber. Moreover, there is no fear of damaging the transportation mechanism due to the heat generated from the heater.

Figure 6A:
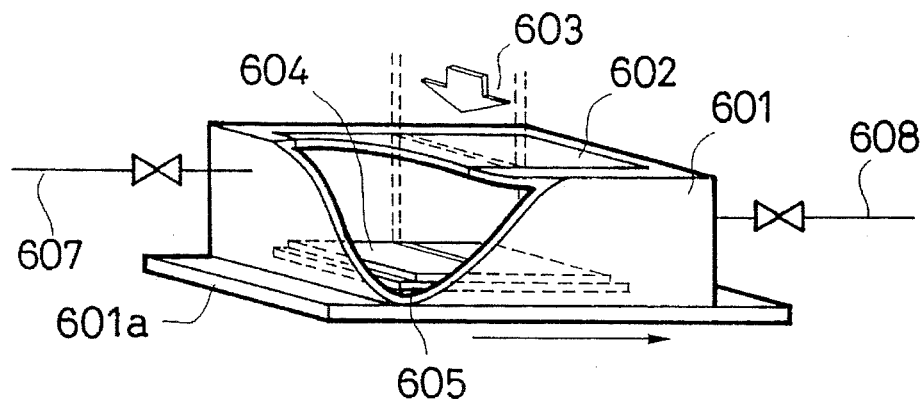
FIGS. 6(A) and 6(B) show schematically still another apparatus for treating semiconductors (impurity doping) according to still another embodiment of the present invention.
Figure 6B:
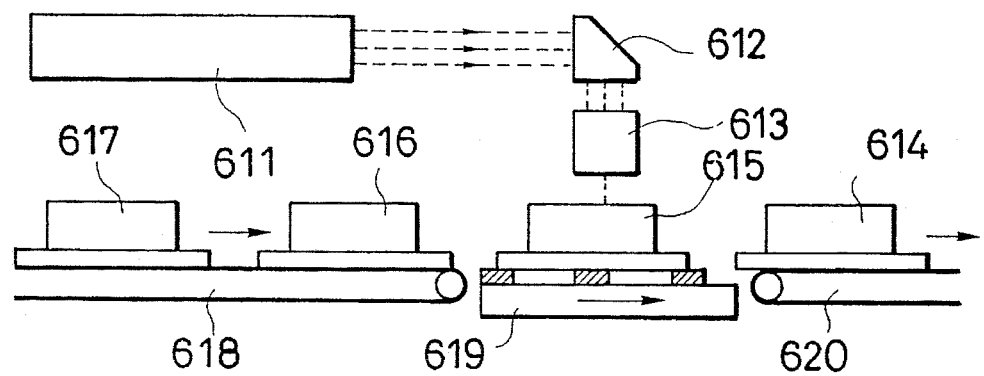

The apparatus shown in FIG. 6 is superior to the one shown in FIG. 5 not only in the points enumerated above, but also in the following points. The type of the apparatus shown in FIG. 5 requires some time before irradiating a laser beam because the chamber had to be evacuated until a sufficiently high vacuum degree is achieved. In other words, the process time in the case using the apparatus of FIG. 5 includes a considerable dead time. In the case using the apparatus shown in FIG. 6, on the other hand, a plurality of chambers as illustrated in FIG. 6(A) may be prepared and rotated to sequentially undergo each of the steps of mounting the sample, vacuum evacuation, laser irradiation, and dismounting the sample. In this manner, the dead time can be cut off. The entire system is shown in FIG. 6(B).

Referring to FIG. 6(B), the chambers 617 and 616 charged with untreated samples are transported while evacuating the chamber, on a continuous transportation mechanism 618 to the foundation 619 equipped with a stage for precision movement. Meanwhile, laser beam is emitted from a laser apparatus 611, processed in proper optical apparatuses 612 and 613, and irradiated to a sample charged in a chamber 615 mounted on the stage. A chamber 614 subjected to a complete laser irradiation after sufficiently moving the stage is again transported on a continuous transportation mechanism to the next step. During this transportation step, the heater is turned off and the chamber is evacuated, so that the sample may be dismounted after a sufficiently low temperature is achieved.

It can be seen that the present embodiment allows the process to advance in continuous steps. Accordingly, the time waiting for the evacuation of the chamber can be cut off to thereby increase the throughput. As a matter of course, it should be taken into consideration that the embodiment referred to FIG. 6 provides a higher throughput at the expense of involving more chambers as compared with the embodiment referred to FIG. 5. Thus, in the practical implementation of the process, the scale of mass production and the quantity of investment must be taken into consideration.

Figure 7:
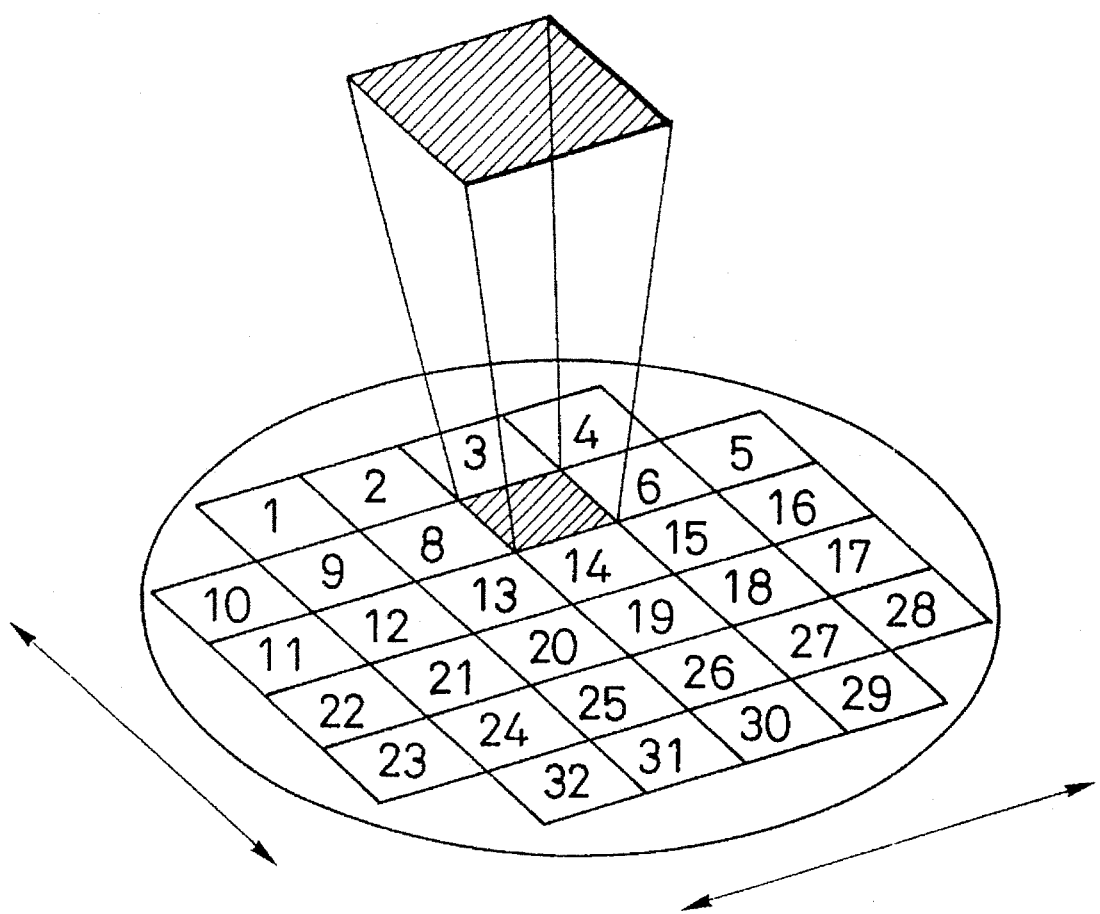
FIG. 7 shows a laser irradiation process according to an embodiment of the present invention.

In the above embodiments illustrated in FIGS. 5 and 6, laser beams having a slit-like cross section were used. However, the laser beam may have a square or a rectangular cross section. In such a case referring to FIG. 7, the substrate made from a semiconductor wafer and the like may be separated into a plurality of sections (32 sections in the case shown in FIG. 7), and a laser beam may be irradiated sequentially to each of the sections. For example, if the laser is operated at a repetition frequency of 200 Hz, the process time per portion of the wafer is 0.1 second. Then, a single wafer is processed within 10 seconds (the time loss for moving the wafer up and down or right and left inclusive). By automating the transportation of the wafers, 200 wafers can be processed per hour. Then, the process yields a productivity well comparable to any of the conventional processes.

Similar apparatuses for use in laser doping processes are disclosed in Japanese patent application No. Hei-3-383981 (filed Oct. 4, 1991), No. Hei-3-290719 (filed Oct. 8, 1991), and No. Hei-4-100479 (filed Mar. 28, 1991). The present invention enables fabrication of, for example, devices having a channel length of 0.5 μm or less with excellent reproducibility. Furthermore, it also enables formation of diffusion domains (impurity regions) 0.1 μm or less in depth. Accordingly, the present invention is particularly suited for use in the fabrication of such devices.

The present invention is illustrated in greater detail referring to non-limiting examples below. It should be understood, however, that the present invention is not to be construed as being limited thereto.

EXAMPLE 1

Referring to FIG. 8, a process for forming a CMOS circuit on a single crystal silicon substrate according to the present invention is described.

A field insulator 702 was formed on a (100) plane of a single crystal silicon substrate 701 by a so-called LOCOS process. A P-type well 703 was formed by thermally diffusing boron inside a part of the portion of the substrate which remained uncovered by the field insulator. The area except for the P-type well was covered with a masking material 704, and laser was irradiated in an atmosphere containing 2% by volume of diborane ($B_2H_8$) to the entire surface of the substrate to allow boron to diffuse inside the P-type well in an area ranging from the surface to a depth of 50 nm. Thus was obtained a $P^+$region 705 (see FIG. 8(A)).

The masking material 704 for use in the present example preferably has excellent resistance against laser irradiation, however, it need not be opaque to a laser light. For example, silicon nitride and silicon oxide suffices the above conditions. Carbon film can be used as well.

Laser doping was performed using the apparatus shown in FIG. 5. More specifically, boron (B) was incorporated into the sample by subjecting the sample to laser irradiation under a mixed gas atmosphere of $PH_3$/Ar using the apparatus illustrated in FIG. 5, but without heating the sample. A KrF excimer laser operating at a wavelength of 248 nm and at a pulsed mode with a pulse width of 20 nsec was used. The laser beam was irradiated 2 to 20 shots per point at an energy density in the range of from 150 to 350 mJ/cm$^2$. By lowering the sample temperature to room temperature or lower, and preferably to −50° C., the diffusion of the impurities can be suppressed to provide a shallower impurity-doped $P^+$region 705. It is not preferred, however, to lower the temperature of the sample to a congealing point or a boiling point of diborane or lower.

An $N^+$region 706 was formed on the surface of the silicon substrate by a process similar to above, except for doping phosphorus using phosphine. Then, a gate dielectric 707 as well as gate contacts 708 and 709 were formed in the same manner as in the conventional process (see FIG. 8(B)).

Then, the region of P-channel TFT (corresponding to the right side of the figure) was covered with a masking material 710, and the entire structure was subjected again to doping process using the laser doping apparatus illustrated in FIG. 5. Phosphine was used as the impurity gas in this case, and the substrate was heated to a temperature in the range of from 200° to 450° C. The laser was operated under the same energy and the number of shots as those used in the previous step. Because the sample was heated in this case, more diffusion occurred as compared to the previous doping step and the source and drain regions 711 were more deeply doped with phosphorus to provide an N-type conductive region. In contrast to the source and drain regions 711, the region under the gate contact remains unirradiated by the laser and thereby undoped, because the gate insulator and the gate contact serve as the mask. Thus, the region under the gate contact maintains the initial $N^+$-type conductivity (FIG. 8 (C)). The doping process is effected typically under an atmosphere diluted with $H_2$ and containing $PH_3$ at a concentration of 5% while maintaining the sample at a temperature of 350° C. under a pressure of from 0.02 to 1.00 Torr, and operating a KrF excimer laser at a wavelength of 248 nm, an energy density of from 150 to 350 mJ/cm², and at a number of pulses of 10 shots.

Similarly, a P-type region was formed in the region of the P-channel TFT (shown in the right side of the figure) by effecting laser doping under a diborane atmosphere. Thus was obtained a P-channel TFT.

Then, an interlayer insulator 712 was formed following a conventional process, and a contact hole was provided to form a contact with connection 713. The contact and connection may be made of a single film of a metal, a semiconductor film, or a multilayered film such as a laminate of titanium nitride and aluminum.

The transistor according to the present example is of a so-called buried channel type, in which the surface of the channel forming region remains un-inverted even when a signal is applied to the gate, but in which a deeper region provides the channel Thus, a highly reliable transistor was realized because the gate insulator remain undestroyed by hot electrons and the like.

Laser doping process was employed in the present example to form the buried channel. It can be understood from the foregoing description, however, that the process according to the present invention can be used as well for the purpose of controlling the threshold voltage.

EXAMPLE 2

Referring to FIG. 9, a process for fabricating a MOS device having a floating gate, e.g., an EPROM, an EEPROM, and a flash memory, is described.

A field insulator 751 was selectively formed on the surface of a (100) plane of a single crystal silicon substrate, and gate contact portions 752 and 753 were then formed also on the substrate. The detailed structure of the gate contact portion is shown in FIG. 9(E). Referring to FIG. 9(E), the gate contact portion 0.5 µ m in width comprises a gate dielectric 761, a phosphorus-doped polysilicon floating gate 762, a phosphorus-doped polysilicon control gate 763, and an insulating film 764 covering the entire portion. Preferably, the insulating film 764 is made from the same oxide constituting the control gate and the floating gate. Those can be oxidized by anodic oxidation or thermal oxidation. The anodic oxidation may be effected either in a wet process or in a dry process, and the same process described in Japanese patent application No. Hei-3-278705 (filed Sep. 30, 1991) can be followed. In a case thermal oxidation is used, the process described in Japanese patent application No. Hei-3-278706 (filed Sep. 30, 1991) can be employed.

Then, a masking material 754 was formed selectively, and phosphorus was incorporated into the silicon substrate by ion implantation using the masking material and the gate contact portion as the mask. Thus, an N-type region about 0.2 µ m in depth was formed by heating and thereby allowing phosphorus thus introduced into the substrate to diffuse. It can be seen from FIG. 9(A) that the impurity region formed at this point extends under the gate contact portion.

Figure 9A:
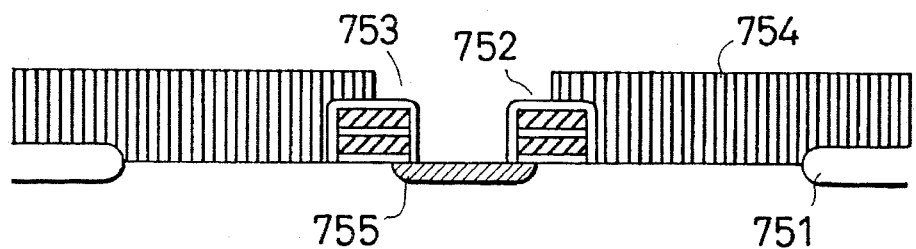
FIGS. 9(A) to 9(E) show another process of fabricating a semiconductor device according to another embodiment of the present invention.
Figure 9B:
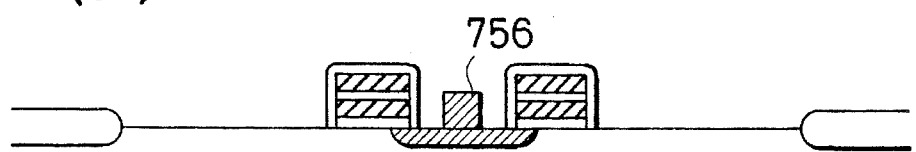
Figure 9C:
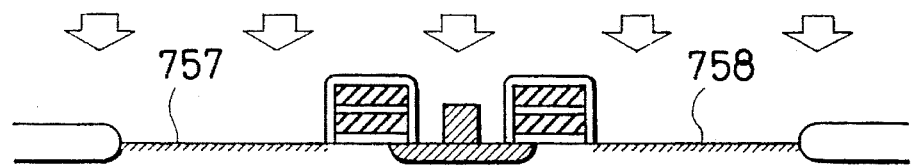

Referring to FIG. 9(B), a phosphorus-doped polysilicon connection 756 was formed to provide a word line. When an impurity region 755 having a sufficiently low resistance is provided, however, no additional polysilicon is necessary and the impurity region 755 itself can be used as the word line.

A laser doping process according to the present invention was performed thereafter to introduce phosphorus and to form shallow impurity regions 757 and 758 each within a depth of 50 nm. As shown in FIG. 6(B), a plurality of chambers 814 to 815 each charged with single wafer were transferred continuously for laser doping. A typical doping process was effected under an atmosphere diluted with $H_2$ and containing $PH_3$ at a concentration of 5% while maintaining the sample at room temperature under a pressure of from 0.02 to 1.00 Torr, and operating a KrF excimer laser at a wavelength of 248 nm, an energy density of from 150 to 350 mJ/cm², and at a number of pulses of 10 shots.

Figure 9D:
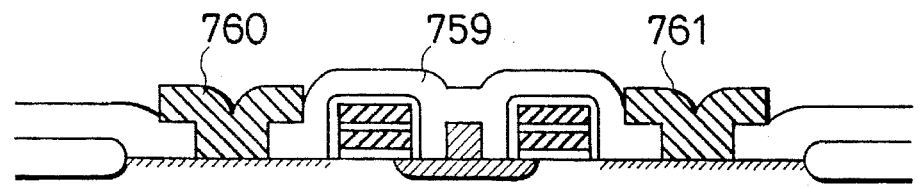
Figure 9E:
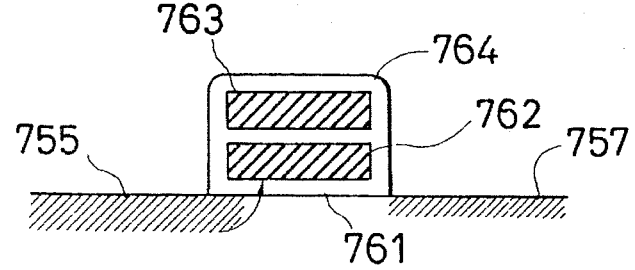

Thus were formed shallow impurity regions. Then, an interlayer insulator 759 was deposited according to a conventional process, and a contact hole was provided to form metallic contacts with connection 780 and 781. Thus were obtained two complete EEPROM devices as shown in FIG. 9(D). The connection 780 and 781 each provide the bit line for the respective devices.

In the device obtained in the present example, the impurity regions provided on the right and the left sides of the gate contact portion differ from each other in shape. More specifically, one is a deep impurity region 755 penetrating farther into the portion under the gate contact, and the other is a shallow impurity region 757 having no overlaps, but rather, in which an offset region is formed therein by the oxide of the gate contact portion. Practically, the penetrating portion is 50 nm or less. As a result, the carrier is injected into the floating gate from the deep impurity region as indicated with an arrow in FIG. 9(E).

EXAMPLE 3

Referring to FIG. 10, a process for fabricating a MOSFET having a lightly doped drain (LDD) structure according to the present invention is described.

According to a conventional process, a field insulator 802 was formed on a single crystal silicon substrate 801, and a gate dielectric 803 as well as a gate contact portion 804 were formed subsequently on the same substrate. Then, phosphorus was introduced into the substrate according to the laser doping process according to the present invention to form a shallow lightly doped N⁻-type impurity region 805 to a depth of 50 nm (see FIG. 10(A)).

Figure 10A:
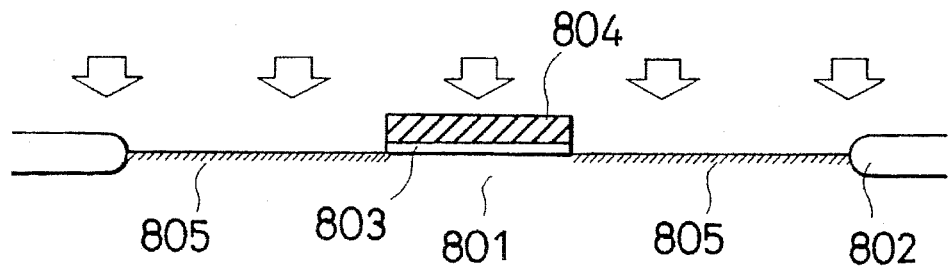
FIGS. 10(A) to 10(D) show further another process of fabricating a semiconductor device according to further another embodiment of the present invention.
Figure 10B:
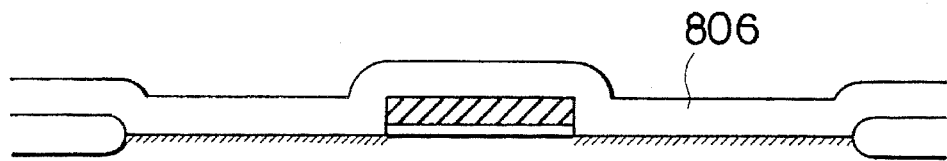
Figure 10C:
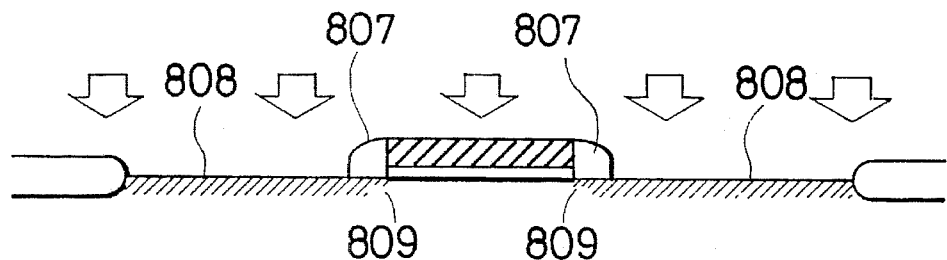
Figure 10D:
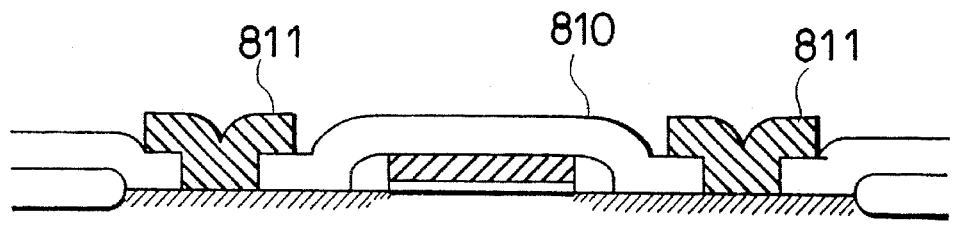

Then, a silicon oxide film 806 was deposited as shown in FIG. 10(B), and anisotropically etched to leave out a side wall portion 807 for the gate contact. Then, ion implantation was effected to heavily dope phosphorus ions to form an N⁺region 808. Thus, the previous N⁻region 805 remained only in the portion underlying the side wall to provide an LDD region 809 (see FIG. 10(C)).

Finally, an interlayer insulator 810 and a metal contact with connection 811 was formed to obtain a complete device. In this example, a combination of a conventional process and the doping process according to the present invention was employed to form an LDD. However, other processes as described, for example, in the inventions of the present applicants, i.e., Japanese patent application No. Hei-3-238710 (filed Aug. 26, 1991), No. Hei-3-238711 (filed Aug. 26, 1991), and No. Hei-3-238712 (filed Aug. 26, 1991), can be employed as well.

The present invention enables stable fabrication of MOS devices having a channel length of 1.0 µ m or less, typically from 0.1 to 0.3 µ m, and a shallow impurity region 0.1 µ m or less in depth. The above examples were confined to those using single crystal silicon as the semiconductor substrate, however, it can be readily understood that the above processes are also applicable to semiconductor devices using polycrystalline silicon. It can be seen therefore that the present invention is industrially valuable.

While the invention has been described in detail and with reference to specific embodiments thereof, it will be apparent to one skilled in the art that various changes and modifications can be made therein without departing from the spirit and scope thereof.

What is claimed is:

1. A method for forming a semiconductor device comprising:

forming a buried channel in a semiconductor layer by doping said semiconductor layer with an impurity by irradiating a laser pulse to a gaseous atmosphere comprising said impurity.

2. The method of claim 1 wherein said atmosphere further comprises a gas selected from the group consisting of hydrogen, fluorine, helium, argon and neon.

3. The method of claim 1 wherein said laser pulse has a pulse width of 1 μ sec. or shorter.

4. The method of claim 1 wherein said laser pulse has an energy density of 150 to 350 mJ/cm$^2$.

5. The method of claim 1 wherein said laser pulse is an excimer laser pulse.

6. A method for forming a semiconductor device comprising:

introducing one impurity into one region of a semiconductor by applying a light energy in an atmosphere including the one impurity;

forming a gate electrode on the semiconductor; and introducing another impurity into another region of the semiconductor using the gate electrode as a mask, wherein the one region overlaps with the another region.

7. The method of claim 6 wherein the light energy is a laser.

8. The method of claim 7, wherein the laser is an excimer laser.

9. A method for forming a semiconductor device comprising:

introducing one impurity into one region of a semiconductor by applying a light energy in an atmosphere including the one impurity;

forming a gate electrode on the semiconductor; and introducing another impurity into another region of the semiconductor using the gate electrode as a mask, wherein the one region is formed to a depth shallower than that of the another region.

10. The method of claim 9 wherein the one region is 0.1 μ m or less in depth.

11. The method of claim 9 wherein the light energy is a pulse laser.

12. A method for forming a semiconductor device comprising:

introducing one impurity into one region of a semiconductor having a plurality of areas by scanning and applying a light energy to the plurality of areas in an atmosphere including the one impurity;

forming a gate electrode on the semiconductor; and introducing another impurity into another region of the semiconductor using the gate electrode as a mask, wherein the one region overlaps with the another region.

13. The method of claim 12 wherein the light energy is a laser.

14. A method for forming a semiconductor device comprising:

introducing one impurity into one region of a semiconductor having a plurality of areas by scanning and applying a light energy to the plurality of areas in an atmosphere including the one impurity;

forming a gate electrode on the semiconductor; and introducing another impurity into another region of the semiconductor using the gate electrode as a mask, wherein the one region is formed to a depth shallower than that of another region.

15. The method of claim 14 wherein the one region is 0.1 μ m or less in depth.

16. The method of claim 14 wherein the light energy is a pulse laser.

17. A method for forming a semiconductor device comprising:

forming a gate electrode on a semiconductor;

introducing an impurity into the semiconductor by applying a light energy in an atmosphere including the impurity using the gate electrode as a mask, to form a first impurity region, forming mask materials on both sides of the gate electrode; and introducing said impurity into the semiconductor using the gate electrode and the mask materials as masks, to form a second impurity region which overlaps with the first impurity region and has a depth deeper than that of the first impurity region, wherein an LDD region is formed in a portion of the first impurity region which does not overlap with the second impurity region.

18. The method of claim 17 wherein the first impurity region is 0.1 μ m or less in depth.

19. The method of claim 17 wherein the light energy is a pulse laser.

20. A method for forming a semiconductor device comprising:

introducing an impurity into a semiconductor by applying a light energy, to form a shallow impurity region; and introducing the impurity into the semiconductor by ion implantation, to form a deep impurity region deeper than said shallow impurity region which overlaps with the shallow impurity region.

21. The method of claim 20 wherein the shallow impurity region is 0.1 μm or less in depth.

22. The method of claim 20 wherein the light energy is a pulse laser.

23. The method of claim 20 wherein the deep impurity region is formed using a gate electrode as a mask.

24. The method of claim 20 wherein the deep impurity region is formed using both a gate electrode and a first mask as masks, and the shallow impurity region is formed using the gate electrode as a mask.

* * * * *